(12) United States Patent  (10) Patent No.: US 9,601,535 B2
Jian et al.  (45) Date of Patent: Mar. 21, 2017

(54) SEMICONDUCATOR IMAGE SENSOR HAVING COLOR FILTERS FORMED OVER A HIGH-K DIELECTRIC GRID

(71) Applicant: Taiwan Semiconductor Manufacturing Company, Ltd., Hsin-Chu (TW)

(72) Inventors: Shiu-Ko Jang Jian, Tainan (TW); Chih-Nan Wu, Tainan (TW); Chun Che Lin, Tainan (TW); Yu-Ku Lin, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 296 days.

(21) Appl. No.: 13/911,277

(22) Filed: Jun. 6, 2013

(65) Prior Publication Data
US 2014/0263956 A1  Sep. 18, 2014

Related U.S. Application Data

(60) Provisional application No. 61/799,934, filed on Mar. 15, 2013.

(51) Int. Cl.
*H01L 27/146* (2006.01)

(52) U.S. Cl.
CPC ...... *H01L 27/1463* (2013.01); *H01L 27/1464* (2013.01); *H01L 27/14621* (2013.01);
(Continued)

(58) Field of Classification Search
CPC ......... H01L 27/14687; H01L 27/14621; H01L 27/1464; H01L 27/14627; H01L 27/14629;
(Continued)

(56) References Cited

U.S. PATENT DOCUMENTS 5,233,181 A * 8/1993 Kwansnick ......... H01L 31/0216
250/208.1
6,566,151 B2 * 5/2003 Yeh ................... H01L 27/14621
438/21
(Continued)

FOREIGN PATENT DOCUMENTS

CN  1992313  7/2007
CN  101853812 A  10/2010

OTHER PUBLICATIONS

Jinn-Kwei Liang et al., U.S. Appl. No. 13/796,576, filed Mar. 12, 2013, entitled "Interface for Metal Gate Integration," 12 pages of specification and 4 pages of drawings.
(Continued)

*Primary Examiner* — Que T Le
*Assistant Examiner* — Jennifer Bennett
(74) *Attorney, Agent, or Firm* — Haynes and Boone, LLP

(57) ABSTRACT

The present disclosure provides an image sensor device and a method for manufacturing the image sensor device. An exemplary image sensor device includes a substrate having a front surface and a back surface, a plurality of sensor elements disposed at the front surface of the substrate. Each of the plurality of sensor elements is operable to sense radiation projected towards the back surface of the substrate. The image sensor also includes a high-k dielectric grid disposed over the back surface of the substrate. The high-k dielectric grid has a high-k dielectric trench and sidewalls. The image sensor also includes a color filter and a microlens disposed over the high-k dielectric grid.

20 Claims, 6 Drawing Sheets

(52) U.S. Cl.
CPC .. *H01L 27/14627* (2013.01); *H01L 27/14629* (2013.01); *H01L 27/14685* (2013.01); *H01L 27/14687* (2013.01)

(58) Field of Classification Search
CPC ......... H01L 27/14625; H01L 27/14603; H01L 27/14685; H01L 27/14663; H01L 31/02162
USPC ..... 250/208.1, 226, 216, 239; 257/440, 443, 257/431, 432, 433, 434, 435, 444, 447; 348/272, 273, 281
See application file for complete search history.

(56) References Cited

U.S. PATENT DOCUMENTS

| | | | | |
|---|---|---|---|---|
| 7,193,289 | B2* | 3/2007 | Adkisson | 257/431 |
| 7,358,583 | B2* | 4/2008 | Reznik | H01L 27/14625 257/222 |
| 8,815,630 | B1* | 8/2014 | JangJian | H01L 21/02112 257/E31.127 |
| 2005/0101049 | A1* | 5/2005 | Kim | 438/66 |
| 2005/0287479 | A1* | 12/2005 | Moon | 430/330 |
| 2006/0189062 | A1* | 8/2006 | Deng | 438/201 |
| 2006/0292731 | A1* | 12/2006 | Kim | H01L 27/14621 438/57 |
| 2007/0145439 | A1* | 6/2007 | Han | H01L 27/14621 257/291 |
| 2007/0148846 | A1* | 6/2007 | Hyun | H01L 27/14621 438/199 |
| 2008/0090323 | A1* | 4/2008 | Wu | 438/70 |
| 2010/0188605 | A1* | 7/2010 | Hasegawa | G02B 5/3033 349/62 |
| 2011/0298074 | A1* | 12/2011 | Funao | H01L 27/14629 257/432 |
| 2012/0273906 | A1* | 11/2012 | Mackey | 257/432 |

OTHER PUBLICATIONS

Chinese Application No. 201310451790.0, Office Action mailed Oct. 26, 2016, 8 pgs.

* cited by examiner

SEMICONDUCATOR IMAGE SENSOR HAVING COLOR FILTERS FORMED OVER A HIGH-K DIELECTRIC GRID

This patent claims the benefit of U.S. Ser. No. 61/799,934 filed Mar. 15, 2013, which is hereby incorporated by reference. This patent also is related to U.S. Ser. No. 13/796,576 filed Mar. 12, 2013, which is incorporated by reference in its entirety.

BACKGROUND

Integrated circuit (IC) technologies are constantly being improved. Such improvements frequently involve scaling down device geometries to achieve lower fabrication costs, higher device integration density, higher speeds, and better performance. Along with the advantages realized from reducing geometry size, improvements are being made directly to the IC devices. One such IC device is an image sensor device. An image sensor device includes a pixel array for detecting light and recording intensity (brightness) of the detected light. The pixel array responds to the light by accumulating a charge—the more light, the higher the charge. The charge can then be used (for example, by other circuitry) to provide a color and brightness that can be used for a suitable application, such as a digital camera. Common types of pixel grids include a charge-coupled device (CCD) image sensor or complimentary metal-oxide-semiconductor (CMOS) image sensor device.

One type of image sensor device is a backside illuminated image sensor (BIS) device. BIS devices are used for sensing a volume of light projected towards a backside surface of a substrate (which supports the image sensor circuitry of the BIS device). The pixel array is located at a front side of the substrate and the substrate is thin enough so that light projected towards the backside of the substrate can reach the pixel array. BIS devices provide a high fill factor and reduced destructive interference, as compared to front-side illuminated (FSI) image sensor devices. However, due to device scaling, improvements to BIS technology are continually being made to further improve BIS device quantum efficiency. Accordingly, although existing BIS devices and methods of fabricating these BIS devices have been generally adequate for their intended purposes, as device scaling down continues, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
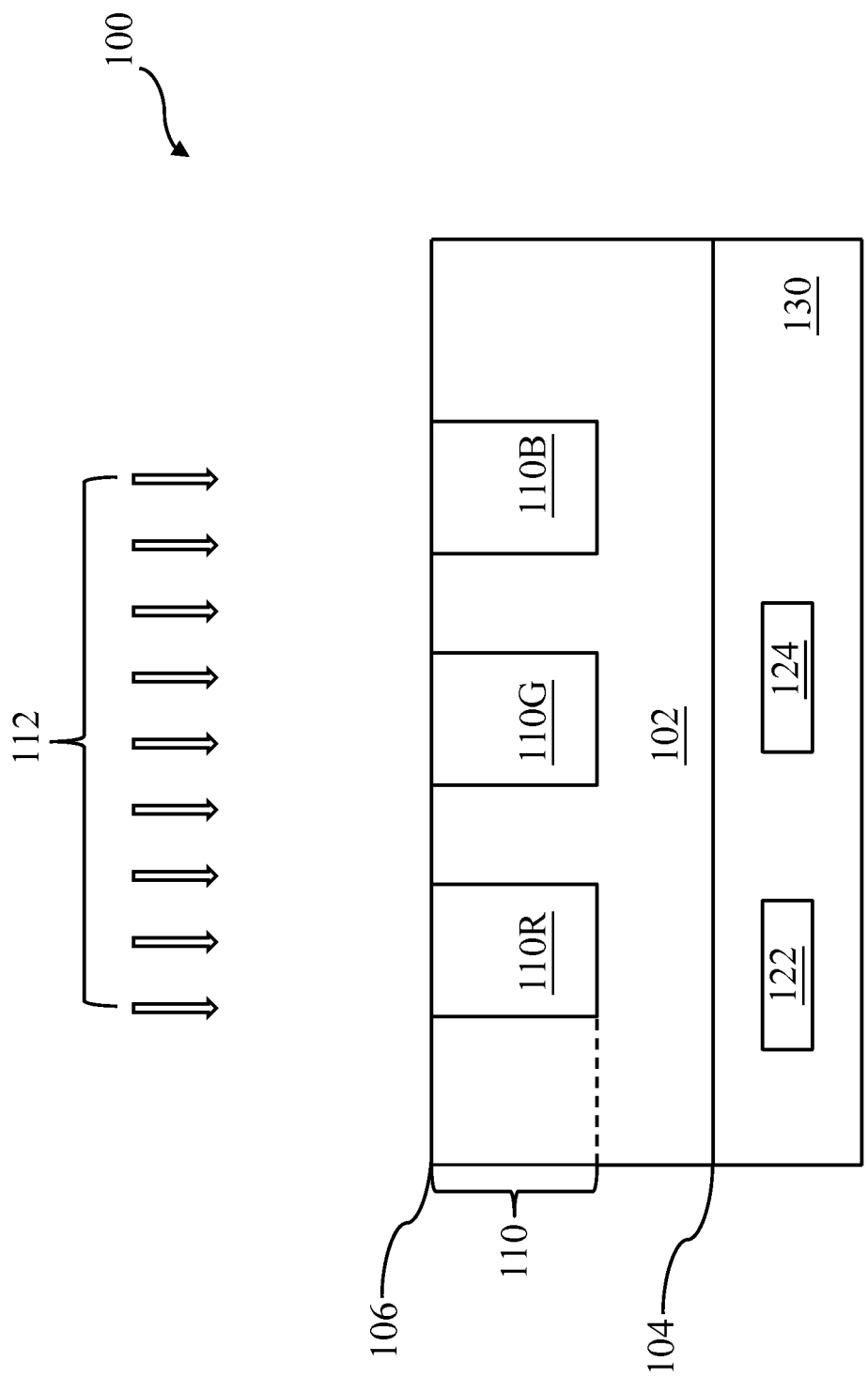
FIG. 1 is a diagrammatic sectional side view of an integrated circuit device precursor according to various aspects of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

FIG. 1 is a diagrammatic sectional side view, in portion, of an embodiment of an integrated circuit (IC) device precursor according to various aspects of the present disclosure. An example IC device precursor 100 may be an IC chip, system on chip (SoC), or portion thereof, that includes various passive and active microelectronic components, such as resistors, capacitors, inductors, diodes, metal-oxide-semiconductor field effect transistors (MOSFET), complementary MOS (CMOS) transistors, bipolar junction transistors (BJT), laterally diffused MOS (LDMOS) transistors, high power MOS transistors, fin-like field effect transistors (FinFET), other suitable components, or combinations thereof.

The IC device precursor 100 may include a first semiconductor wafer stacked on top of a second semiconductor wafer. For example, the first semiconductor wafer is an image sensor, such as a backside illuminated image sensor (BIS), a complementary metal-oxide-semiconductor (CMOS) image sensor (CIS), a charge-coupled device (CCD), an active-pixel sensor (APS), or a passive-pixel sensor. An image sensor may be fabricated by complementary metal-oxide semiconductor (CMOS) process techniques known in the art. For example, a p-type photo active region and an n-type photo active region are formed over a substrate of the image sensor wafer to form a PN junction, which functions as a photodiode. The image sensor may include a transistor to generate a signal related to the intensity or brightness of light that impinges on the photo active region. The second semiconductor wafer may be an application-specific integrated circuit (ASIC) wafer, or a carrier wafer.

The first and second semiconductor wafers may be bonded together through suitable bonding techniques such as direct bonding. In accordance with some embodiments, in a direct bonding process, the connection between the first and second semiconductor wafers can be implemented through metal-to-metal bonding (e.g., copper-to-copper bonding), dielectric-to-dielectric bonding (e.g., oxide-to-oxide bonding), metal-to-dielectric bonding (e.g., copper-to-oxide bonding), any combination thereof. In some embodiment, the first and second semiconductor wafers are connected to each other through suitable three-dimensional structure. An adhesion layer may also be used. Additionally, a thinning process may be performed to thin either or both semiconductor wafers from the back surface. The thinning process may include a mechanical grinding process and/or a chemical thinning process.

The IC device precursor 100 includes a substrate 102 having a front surface 104 and a back surface 106 (an upside-down position is shown in FIG. 1). In some embodiments, the substrate 102 includes an elementary semiconductor such as silicon or germanium and/or a compound semiconductor, such as silicon germanium, silicon carbide, gallium arsenic, indium arsenide, gallium nitride, and indium phosphide. Other exemplary substrate materials include alloy semiconductors, such as silicon germanium carbide, gallium arsenic phosphide, and gallium indium phosphide. The substrate 102 may also comprise non-semiconductor materials including soda-lime glass, fused silica, fused quartz, calcium fluoride ($CaF_2$), and/or other suitable materials. In some embodiments, the substrate 102 has one or more layers defined within it, such as an epitaxial layer. For example, in one such embodiment, the substrate 102 includes an epitaxial layer overlying a bulk semiconductor. Other layered substrates include semiconductor-on-insulator (SOI) substrates. In one such SOI substrate, the substrate 102 includes a buried oxide (BOX) layer formed by a process such as separation by implanted oxygen (SIMOX). In various embodiments, the substrate 102 may take the form of a planar substrate, a fin, a nanowire, and/or other forms known to one of skill in the art.

The substrate 102 may include one or more doped regions (not illustrated). In the depicted embodiment, the substrate 102 is doped with a p-type dopant. Suitable p-type dopants include boron, gallium, indium, other suitable p-type dopants, and/or combinations thereof. The substrate 102 may also include one or more regions doped with an n-type dopant such as phosphorus, arsenic, other suitable n-type dopants, and/or combinations thereof. Doping may be implemented using a process such as ion implantation or diffusion in various steps and techniques.

The substrate 102 may include isolation features (not illustrated), such as local oxidation of silicon (LOCOS) and/or shallow trench isolation (STI), to separate (or isolate) various regions and/or devices formed on or within the substrate 102. The isolation features include silicon oxide, silicon nitride, silicon oxynitride, other suitable materials, or combinations thereof. The isolation features are formed by any suitable process. For example, forming an STI includes a photolithography process, etching a trench in the substrate (for example, by using a dry etching and/or wet etching), and filling the trench (for example, by using a chemical vapor deposition process) with dielectric material. The filled trench may have a multi-layer structure, such as a thermal oxide liner layer filled with silicon nitride or silicon oxide.

As noted above, the IC device precursor 100 includes sensor elements 110 (also referred to as pixels). The sensor elements 110 detect intensity (brightness) of radiation 112 directed toward the back surface 106 of the substrate 102. In the depicted embodiment, the incident radiation 112 is visual light. Alternatively, the radiation 112 could be infrared (IR), ultraviolet (UV), X-ray, microwave, other suitable radiation type, or combinations thereof. In the depicted embodiment, the sensor elements 110 are configured to correspond with a specific light wavelength, such as a red (R), a green (G), or a blue (B) light wavelength. In other words, the sensor elements 110 are configured to detect intensity (brightness) of a particular light wavelength. In one embodiment, the sensor elements 110 are pixels in a pixel array.

In the depicted embodiment, the sensor elements 110 include a photodetector, such as a photodiode, that includes a light sensing region (or photo-sensing region) 110R, 110G, and 110B, respectively, which detect intensity (brightness) of red, green, and blue light wavelengths, respectively. The light sensing regions (or photo-sensing regions) 110R, 110G, and 110B may include doped regions having n-type and/or p-type dopants formed in the substrate 102. In one embodiment, the light sensing regions 110R, 110G, and 110B may be an n-type doped region, formed by a method such as diffusion and/or ion implantation. The sensor elements 110 further include various transistors, such as a transfer transistor (not illustrated), a reset transistor (not illustrated), a source-follower transistor (not illustrated), a select transistor (not illustrated), other suitable transistors, or combinations thereof. The light sensing regions 110R, 110G, and 110B and various transistors (which can collectively be referred to as pixel circuitry) allow the sensor elements 110 to detect intensity of the particular light wavelength. Additional circuitry, input, and/or outputs may be provided to the sensor elements 110 to provide an operation environment for the sensor elements 110 and/or support communication with the sensor elements 110.

The IC device precursor 100 further includes multilayer interconnect (MLI) features disposed over the front surface 104 of the substrate 102, including over the sensor elements 110. The MLI features are coupled to various components of the image sensor, such as the sensor elements 110, such that the various components of the image sensor are operable to properly respond to illuminated light (imaging radiation). The MLI features may include various conductive features, which may be vertical interconnects, such as contacts and/or vias 122, and/or horizontal interconnects, such as lines 124. The various conductive features 122 and 124 may include conductive materials, such as metals. In an example, metals include aluminum, aluminum/silicon/copper alloy, titanium, titanium nitride, tungsten, polysilicon, metal silicide, or combinations thereof.

Conductive features 122 and 124 may be formed by a process including physical vapor deposition (PVD), chemical vapor deposition (CVD), or combinations thereof. Other manufacturing techniques to form the various conductive features 122 and 124 may include photolithography processing and etching to pattern conductive materials to form the vertical and horizontal interconnects. Still other manufacturing processes may be implemented to form the conductive features, such as a thermal annealing to form metal silicide. The metal silicide used in the multilayer interconnects may include nickel silicide, cobalt silicide, tungsten silicide, tantalum silicide, titanium silicide, platinum silicide, erbium silicide, palladium silicide, or combinations thereof.

It is understood that the MLI features are not limited by the number, material, size, and/or dimension of the conductive features 122 and 124 depicted, and thus, the MLI features may include any number, material, size, and/or dimension of conductive features depending on design requirements of the integrated circuit device precursor 100.

The various conductive features 122 and 124 of the MLI features are disposed in an interlayer (or inter-level) dielectric (ILD) layer 130. The ILD layer 130 may include silicon dioxide, silicon nitride, silicon oxynitride, TEOS oxide, phosphosilicate glass (PSG), borophosphosilicate glass (BPSG), fluorinated silica glass (FSG), carbon doped silicon oxide, amorphous fluorinated carbon, Parylene, polyimide, other suitable material, and/or combinations thereof. Common methods for forming ILD layer 130 include thermal oxidation, chemical vapor deposition (CVD), high-density plasma CVD (HDP-CVD), physical vapor deposition (PVD), atomic layer deposition (ALD), spin-on deposition, and/or other suitable deposition processes. The ILD layer 130 may include multiple layers made by different dielectric materials.

Figure 2:
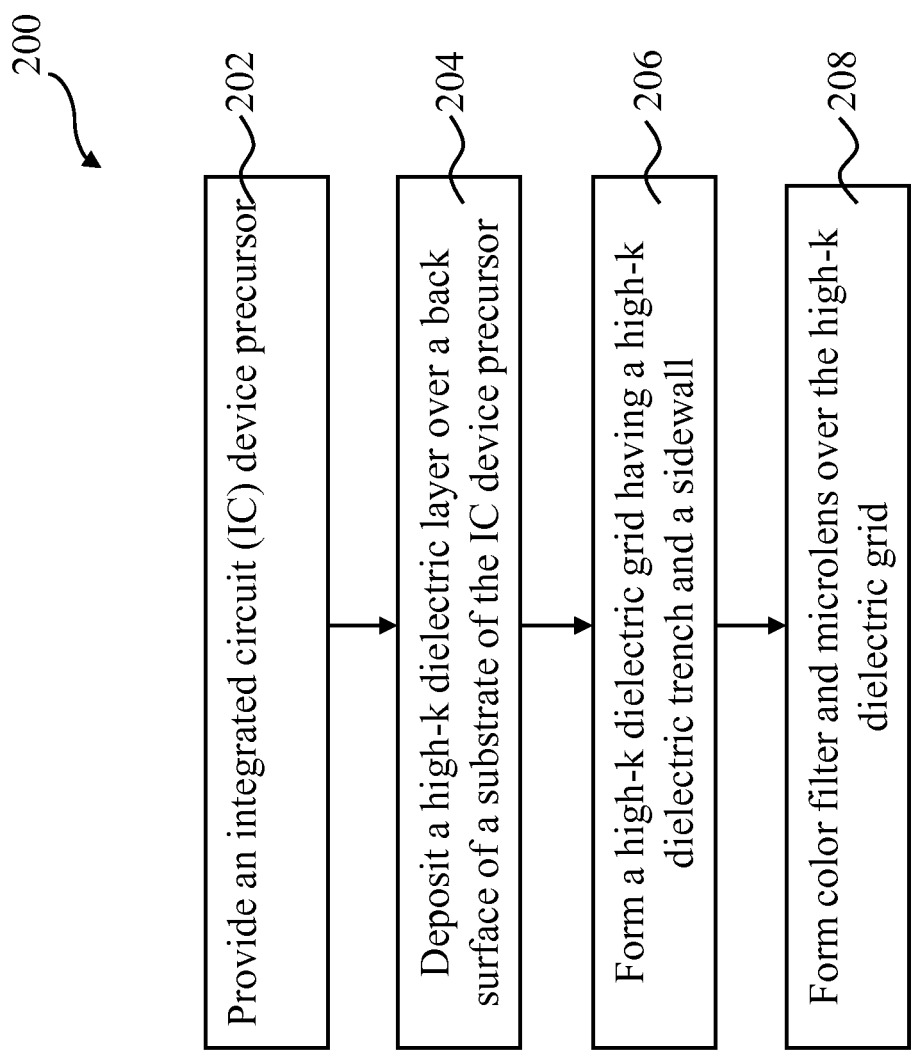
FIG. 2 is a flow chart of a method for fabricating a high-k dielectric grid for an integrated circuit device according to various aspects of the present disclosure.

FIG. 2 is a flowchart of a method 200 of forming a high-k dielectric grid for an integrated circuit device according to various aspects of the present disclosure. FIGS. 3-4 and 5-6 are cross-sectional views of an example IC device 300 undergoing processes according to the method of FIG. 2. It is understood that additional steps can be provided before, during, and after the method, and some of the steps described can be replaced or eliminated for other embodiments of the method.

Figure 3:
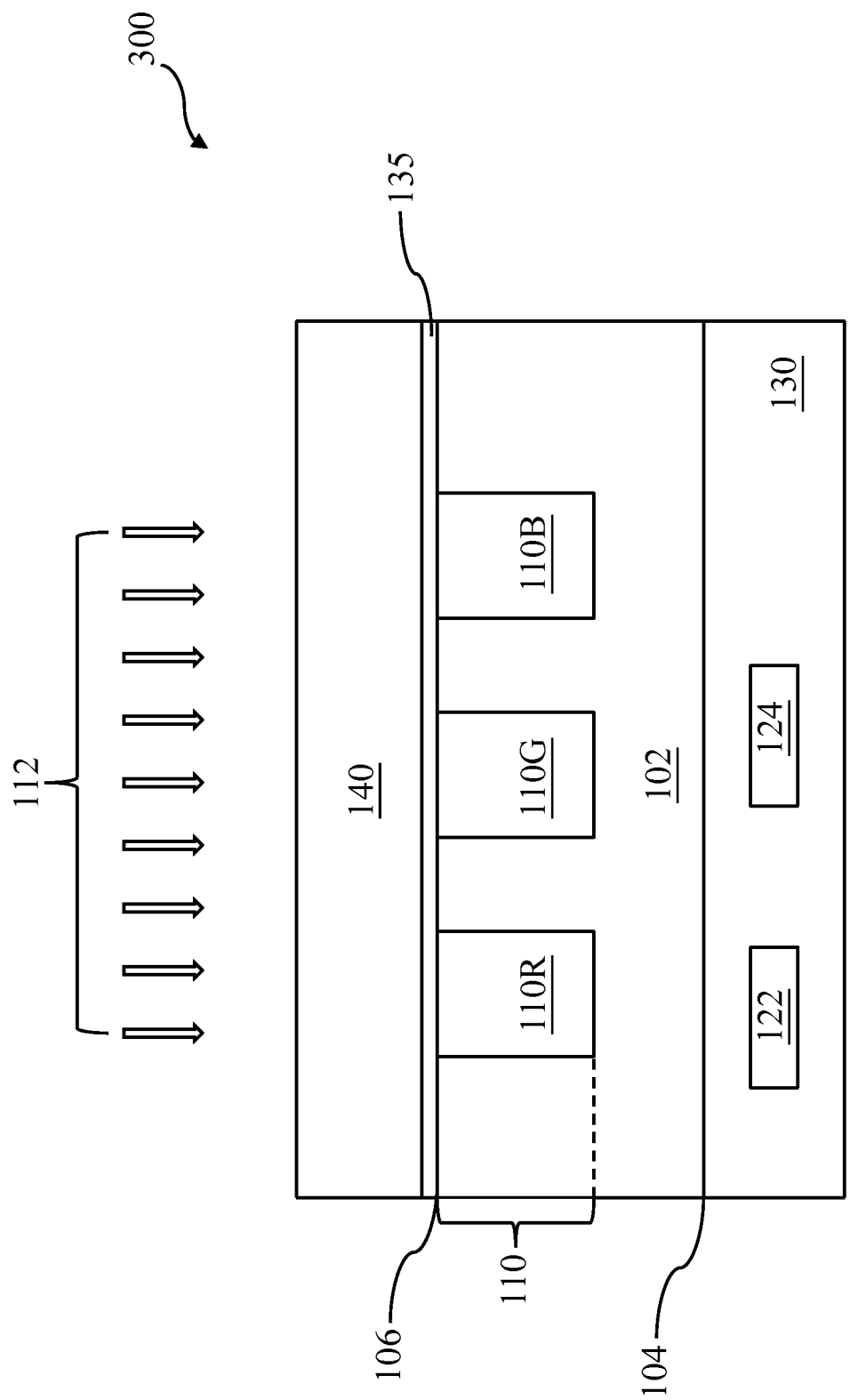
FIGS. 3-6 are diagrammatic sectional side views of an integrated circuit device at various fabrication stages according to the method of FIG. 2.

Referring to FIGS. 2 and 3, the method 200 begins at step 202 by providing the IC device precursor 100 and then proceeds to step 204 by depositing a high-k dielectric layer 140 over the back surface 106 of the substrate 102. In one embodiment, prior to depositing the high-k dielectric layer 140, a bottom anti-reflection coating (BARC) layer 135 is formed over a back surface 106 of the substrate 102. The BARC layer 135 may include a nitride material, an organic material, an oxide material and/or the like. The BARC layer 135 may be formed using suitable techniques such as CVD, PVD and/or the like.

The high-k dielectric layer 140 may include $HfO_2$, HfSiO, HfSiON, HfTaO, HfSiO, HfZrO, zirconium oxide, aluminum oxide, hafnium dioxide-alumina ($HfO_2$—$Al_2O_3$) alloy, other suitable high-k dielectric materials, and/or combinations thereof. The high-k dielectric layer 140 may be deposited by CVD, PVD, ALD, or other suitable methods, and/or combinations thereof. In one embodiment, a thickness of the high-k dielectric layer 140 is in a range of 300 nm to 600 nm.

Figure 4:
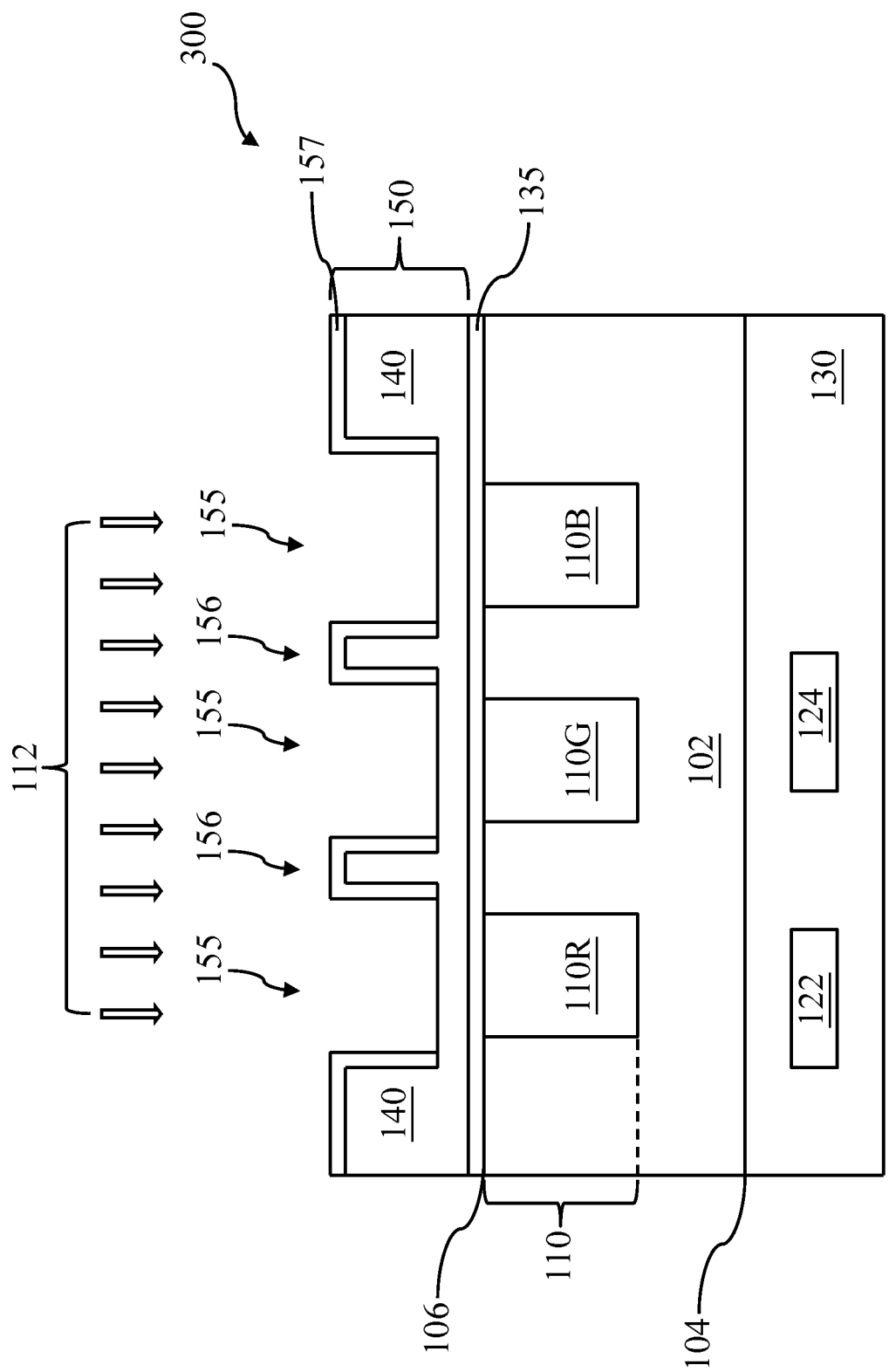

Referring to FIGS. 2 and 4, the method 200 proceeds to step 206 by recessing a portion of the high-k dielectric layer 140 to form a high-k dielectric grid 150. In the present embodiment, the high-k dielectric grid 150 includes a high-k dielectric trench 155 and sidewalls 156. The high-k dielectric trench 155 is formed within the high-k dielectric layer 140 and has a remaining high-k dielectric layer 140 as its bottom. That is, the high-k trench 155 does not, in the present embodiment, extend all the way through the high-k dielectric layer 140. The high-k dielectric grid 150 may be formed by lithography and etch processes. As an example, a patterned photoresist layer is formed over the high-k dielectric layer 140 by processes of spin-on coating, exposure and developing. Then the high-k dielectric layer 140 is etched through the patterned photoresist. The etching process may include a dry etching process, a wet etching process, and/or a combination thereof. In the present embodiment, the high-k dielectric trench 155 is aligned with respective light sensing regions 110R, 110G, and 110B and a height h of the sidewalls 156 are in a range of 50 nm to 200 nm.

Additionally, a capping layer 157 may be deposited over the sidewall 158 as a moisture resistant layer. The capping layer 157 may include TaO, ZrO, LaO AlO, or other suitable materials and may be formed by processes of deposition, lithography and etching. In one embodiment, a thickness of the capping layer 157 is in a range of 1 nm to 5 nm.

Figure 5:
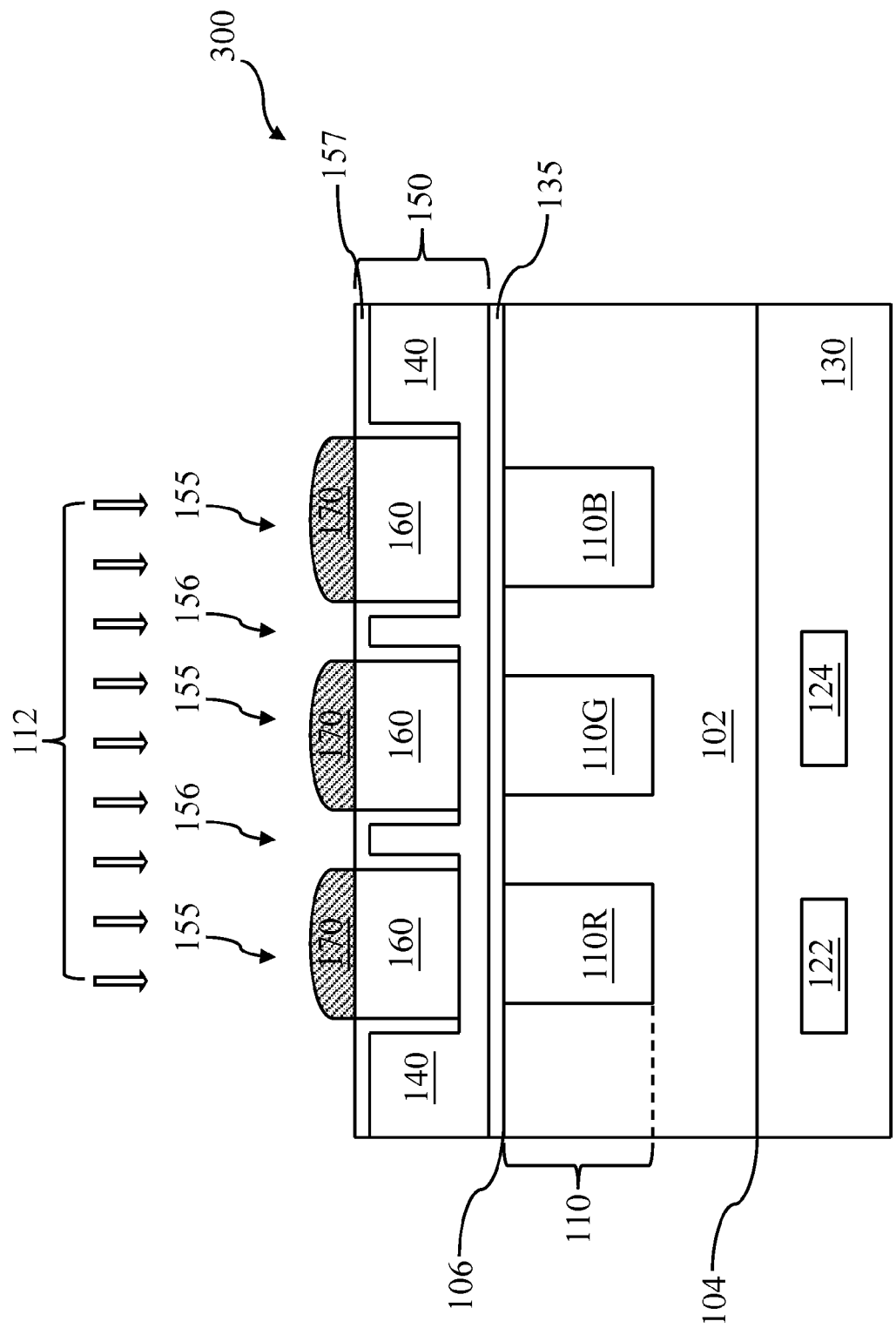

Referring to FIGS. 2 and 5, the method 200 proceeds to step 208 by forming color filters 160 and microlenses 170 over the back surface 106 of the substrate 102. In one embodiment, each of the color filters 160 aligns with the respective light sensing regions 110R, 110G, and 110B and horizontally separated by the sidewalls 156. In another embodiment, the color filters 160 are disposed within the high-k dielectric trench 155. The color filters 160 are designed so that each filters through light of a predetermined wavelength. For example, the color filter 160 aligned with the light sensing region 110R may be configured to filter through visible light of a red wavelength to the light sensing region 110R, the color filter 160 aligned with the light sensing region 110G may be configured to filter through visible light of a green wavelength to the light sensing region 110G, or the color filter 160 aligned with the light sensing region 110B may be configured to filter through visible light of a blue wavelength to the light sensing region 110B. The color filters 160 include any suitable material. In an example, the color filters 160 include a dye-based (or pigment-based) polymer for filtering out a specific frequency band (for example, a desired wavelength of light). Alternatively, the color filters 160 could include a resin or other organic-based material having color pigments.

The microlenses 170, disposed over the back surface 106 of the substrate 102, align with respective light sensing regions 110A, 110G, and 110B of the sensor elements 110 and horizontally separated by the sidewalls 156. In one embodiment, the lenses 170 are disposed over the color filters 160. The microlenses 170 may be in various positional arrangements with the sensor elements 110 and color filters 160, such that the microlens 170 focuses an incoming incident radiation on the respective light sensing regions 110R, 110G, and 110B of the sensor elements 110. The microlenses 170 include a suitable material, and may have a variety of shapes and sizes depending on an index of refraction of the material used for the microlens and/or a distance between the microlens and sensor elements 110. Alternatively, the position of the color filters 160 and microlens layer 170 may be reversed, such that the microlenses 170 are disposed between the back surface 106 of the substrate 102 and color filters 160. The present disclosure also contemplates the integrated circuit device 300 having a color filter layer disposed between microlens layers.

Refractive indexes of the high-k dielectric grid 150, the color filter 160 and the microlens 170 are $n_1$, $n_2$ and $n_3$, respectively. In one embodiment, materials of the high-k dielectric grid 150, the color filter 160 and the microlens 170 are chosen such that $n_1$ is larger than $n_2$ and $n_3$ to reduces/prevents radiation from traveling through and reduce cross talk among the various light sensing regions, such as 110R, 110G and 110B.

Figure 6:
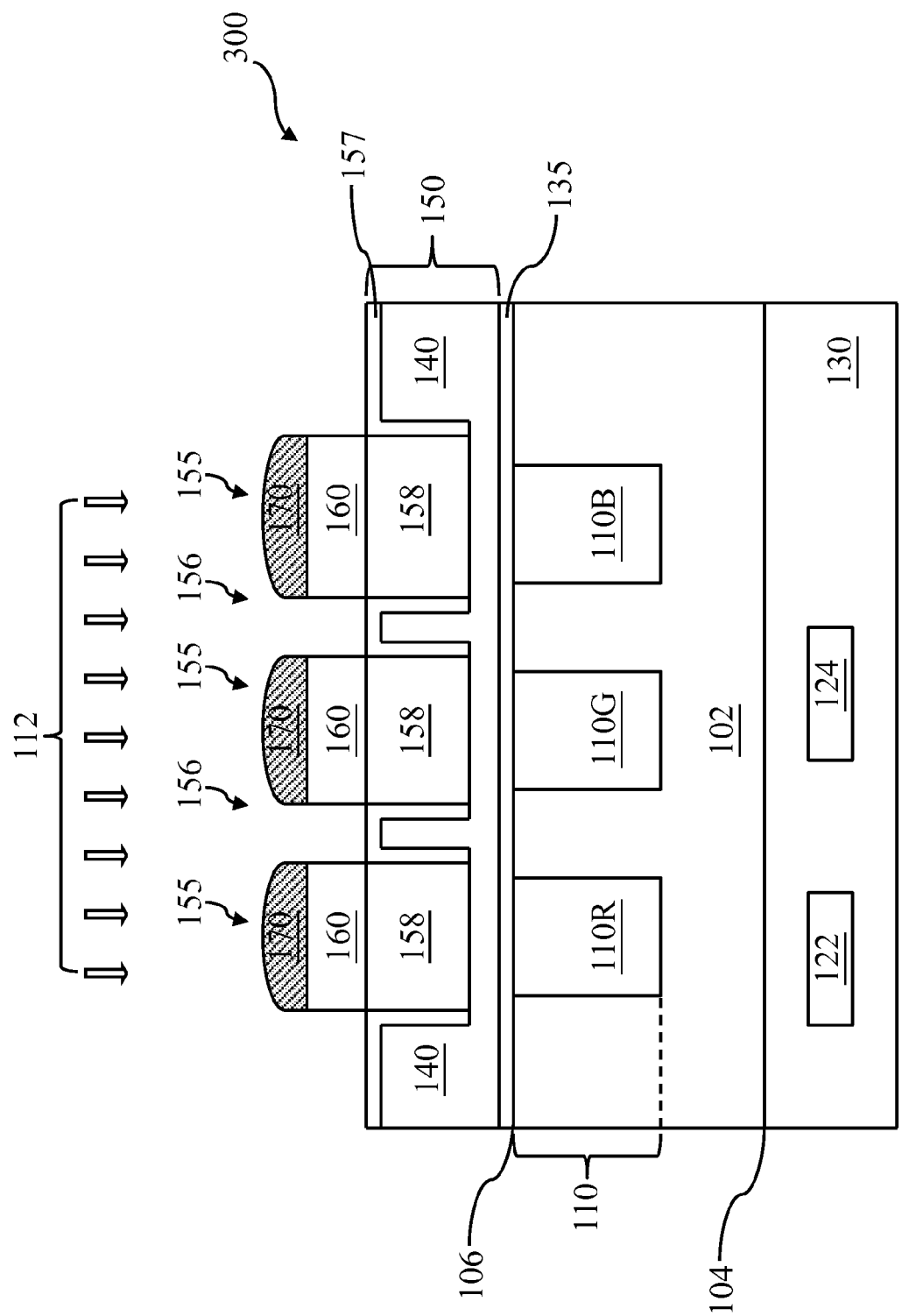

Referring to FIG. 6, in another embodiment, prior to forming the color filter 160 and microlens 170, the high-k dielectric trench 155 is filled by a dielectric layer 158. Additionally, an etching back process, such as chemical mechanical polishing (CMP) is applied to remove excessive the dielectric layer 158 and planarize a top surface of the dielectric layer 158 with a top surface of the high-k dielectric grid 150. The dielectric layer 158 may include silicon oxide, silicon nitride, or other suitable films. In one embodiment, a refractive index of the dielectric layer 158 is substantially larger than the first refractive index of the high-k dielectric grid 150. The color filters 160 and the microlenses 170 are formed over the dielectric layer 158, as shown in FIG. 6.

In operation, the integrated circuit device 300 is designed to receive a radiation 112 traveling towards the back surface 106 of the substrate 102. The microlenses 170 direct the incident radiation 112 to the respective color filters 160. The light then passes through the color filters 160 to a corresponding sensor element 110, specifically to respective light sensing regions 110R, 110G, and 110B. Light passing through to the color filters 160 and sensor elements 110 may be maximized since the light is not obstructed by various device features (for example, gates electrodes) and/or metal features (for example, the conductive features 122 and 134 of the MLI features) overlying the front surface 104 of the substrate 102. Light passing through is also maximized by total reflection effect provided by the high-k dielectric grid 150. As noted above, the high-k dielectric grid 150 reduces crosstalk in the integrated circuit device 300. The desired wavelengths of light (for example, red, green, and blue light) are more efficiently allowed to pass through to the respective light sensing regions 110R, 110G, and 110B of the sensor elements 110. When exposed to the light, the light sensing regions 110R, 110G, and 110B of the sensor elements 110 produce and accumulate (collect) electrons, which may be converted to voltage signals.

Based on the above, the present disclosure offers an integrated circuit device employing a high-k dielectric grid structure and fabrication. The high-k dielectric grid provides a structure with high chemical resistance and a better adhesion capability with other materials. A formation of the high-k dielectric grid achieves forming a high-k dielectric layer and a grid by one layer, which may provide advantages of cost reduction and process simplification. The high-k dielectric grid demonstrates improvements of signal to noise ratio and quantum efficiency.

The present disclosure provides for many different embodiments. For example, an image sensor device includes a substrate having a front surface and a back surface, a plurality of sensor elements disposed at the front surface of the substrate. Each of the plurality of sensor elements is operable to sense radiation projected towards the back surface of the substrate. The image sensor device also includes a high-k dielectric grid disposed over the back surface of the substrate. The high-k dielectric grid includes a high-k dielectric trench having a high-k dielectric layer as its bottom and sidewalls made by a portion of the high-k dielectric layer. The image sensor device also includes a color filter and a microlens disposed over the high-k dielectric grid.

In another embodiment, a device includes a substrate having a front surface and a back surface, a plurality of sensor elements disposed at the front surface of the substrate. The plurality of sensor elements is operable to sense radiation projected towards the back surface of the substrate. The device also includes a plurality of color filter and microlenses disposed over the back surface of the substrate and aligned with the respective sensor element. The device also includes a high-k dielectric grid disposed over the back surface of the substrate. Each of the plurality of color filters and microlenses are horizontally separated from each other by the high-k dielectric grid. a high-k dielectric trench having a high-k dielectric layer as its bottom and sidewalls made by a portion of the high-k dielectric layer.

In yet another embodiment, a method for fabricating a device includes providing a substrate having a front surface and a back surface. A plurality of sensor elements are disposed at the front surface of the substrate and each of the plurality of sensor elements is operable to sense radiation projected towards the back surface of the substrate. The method also includes depositing a high-k dielectric layer having a first refractive index over the back surface of the substrate, removing a portion of the high-k dielectric layer to form a high-k dielectric grid and forming a color filter and a microlens over the high-k dielectric grid.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An image sensor device comprising:
   a substrate having a front surface and a back surface;
   a plurality of sensor elements disposed in the substrate, each of the plurality of sensor elements being operable to sense radiation projected towards the back surface of the substrate;
   a high-k dielectric grid disposed over the back surface of the substrate, the high-k dielectric grid comprising:
     a high-k dielectric trench having a high-k dielectric layer as a bottom surface of the high-k dielectric trench; and
     sidewalls made by a portion of the high-k dielectric layer;
   a capping layer disposed over an upper surface and over the sidewalls of the high-k dielectric grid, wherein a bottom surface of the capping layer is in direct contact with the bottom surface of the high-k dielectric trench;
   a color filter disposed inside the high-k dielectric trench in a manner such that: the capping layer is disposed between the high-k dielectric layer and the color filter, an upper surface of the color filter is disposed above an upper surface of the high-k dielectric trench, and a lower surface of the color filter is in direct contact with the bottom surface of the high-k dielectric trench, wherein the upper surface of the color filter is disposed farther away from the substrate than the lower surface of the color filter; and
   a microlens disposed over the high-k dielectric grid;
   wherein the high-k dielectric grid, color filter and lens are made of materials having different refractive indexes.

2. The image sensor device of claim 1, wherein the high-k dielectric trench aligns with the respective sensor elements.

3. The image sensor device of claim 2, wherein the color filter aligns with the respective high-k dielectric trench.

4. The image sensor device of claim 2, wherein the microlens aligns with respective high-k dielectric trench.

5. The image sensor device of claim 1, wherein the refractive index of the high-k dielectric grid is substantially smaller than the refractive indexes of the color filter and the microlens.

6. The image sensor device of claim 1, wherein the capping layer contains a moisture resistant material.

7. The image sensor device of claim 1, wherein the upper surface of the color filter is coplanar with an upper surface of the capping layer.

8. The image sensor device of claim 1, wherein the capping layer contains TaO, ZrO, LaO, or AlO.

9. The image sensor device of claim 1, further comprising an anti-reflective layer disposed between the back surface of the substrate and the high-k dielectric grid.

10. A device comprising:
a substrate having a front surface and a back surface;
a plurality of sensor elements disposed in the substrate, the plurality of sensor elements being operable to sense radiation projected towards the back surface of the substrate;
a plurality of color filters and microlenses disposed over the back surface of the substrate and aligned with a respective sensor element;
a high-k dielectric grid disposed over the back surface of the substrate such that each of the plurality of color filters and microlenses are horizontally separated from each other by the high-k dielectric grid, wherein the high-k dielectric grid includes:
   a plurality of high-k dielectric trenches each having a high-k dielectric layer as a bottom portion of each of the high-k dielectric trenches, the high-k dielectric layer being in direct physical contact with a bottom surface of the color filters; and
   sidewalls made by a portion of the high-k dielectric layer; and
a capping layer disposed over an upper surface and over the sidewalls of the high-k dielectric grid, wherein the capping layer separates the color filters from the sidewalls of the high-k dielectric layer, and wherein a bottom surface of the capping layer is in direct contact with the bottom surface of the high-k dielectric trenches;
wherein the color filters are disposed within the high-k dielectric trenches such that upper surfaces of the color filters are located closer to the microlenses than an upper surface of the high-k dielectric trenches, and wherein a refractive index of the high-k dielectric grid is substantially smaller than refractive indexes of the color filters and the microlenses.

11. The device of claim 10, wherein each of the microlenses is disposed over a respective one of the high-k dielectric trenches.

12. The device of claim 10, wherein the capping layer contains a moisture resistant material.

13. The device of claim 10, wherein the upper surfaces of the color filters are coplanar with upper surfaces of the capping layer.

14. The device of claim 10, wherein the capping layer contains TaO, ZrO, LaO, or AlO.

15. A method comprising:
providing a substrate having a front surface and a back surface, wherein a plurality of sensor elements are disposed in the substrate, each of the plurality of sensor elements being operable to sense radiation projected towards the back surface of the substrate;
depositing a high-k dielectric layer over the back surface of the substrate, the high-k dielectric layer having a first refractive index;
removing a portion of the high-k dielectric layer to form a high-k dielectric grid having high-k dielectric trenches;
forming a capping layer over an upper surface of the high-k dielectric grid and partially within the high-k dielectric trenches, wherein a bottom surface of the capping layer is formed to be in direct contact with the bottom surface of the high-k dielectric trenches; and
forming a color filter having a second refractive index and a microlens having a third refractive index over the high-k dielectric grid, wherein the first, second, and third refractive indexes are different from one another, and wherein the forming of the color filter comprises forming the color filter within the high-k dielectric trenches such that a top surface of the color filter is formed above a top surface of the high-k dielectric trenches, and a bottom surface of the color filter is formed directly on a bottom surface of the high-k dielectric trenches, wherein portions of the capping layer partially filling the high-k dielectric trenches separate the color filter from sidewalls of the high-k dielectric trenches.

16. The method of claim 15, wherein forming the high-k dielectric grid includes:
forming a patterned hard mask over the high-k dielectric layer; and
etching a portion of the high-k dielectric layer through a patterned hard mask to form the high-k dielectric trenches, wherein a remaining high-k dielectric layer forms bottom surfaces of the high-k dielectric trenches.

17. The method of claim 15, further comprising:
depositing a bottom anti-reflection coating (BARC) layer between the substrate and the high-k dielectric layer.

18. The method of claim 15, wherein the forming of the capping layer comprises forming the capping layer with a moisture resistant material, and wherein the forming of the capping layer is performed such that the top surface of the color filter is coplanar with a top surface of the capping layer.

19. The method of claim 15, wherein the forming of the capping layer comprises forming TaO, ZrO, LaO, or AlO as the capping layer.

20. The method of claim 15, wherein the first refractive index is smaller than the second refractive index and the third refractive index.

* * * * *